United States Patent
Onishi et al.

(10) Patent No.: US 7,829,409 B2
(45) Date of Patent: Nov. 9, 2010

(54) METHOD OF MANUFACTURING SILICON TOPOLOGICAL CAPACITORS

(75) Inventors: Shinzo Onishi, Seminole, FL (US); Lawrence C. Langebrake, Seminole, FL (US)

(73) Assignee: University of South Florida, Tampa, FL (US)

( * ) Notice: Subject to any disclaimer, the term of this patent is extended or adjusted under 35 U.S.C. 154(b) by 910 days.

(21) Appl. No.: 11/679,580

(22) Filed: Feb. 27, 2007

(65) Prior Publication Data
US 2010/0118465 A1    May 13, 2010

Related U.S. Application Data

(63) Continuation of application No. PCT/US2005/030715, filed on Aug. 30, 2005.

(60) Provisional application No. 60/522,186, filed on Aug. 27, 2004.

(51) Int. Cl.
*H01L 21/8242* (2006.01)

(52) U.S. Cl. .................... 438/239; 438/381; 438/700; 257/E21.008

(58) Field of Classification Search ............... 438/239, 438/243, 255, 381, 398, 700; 257/E21.008
See application file for complete search history.

(56) References Cited

U.S. PATENT DOCUMENTS

| | | | |
|---|---|---|---|
| 4,830,978 A | 5/1989 | Teng et al. | |
| 5,006,909 A | 4/1991 | Kosa | |
| 5,065,273 A | 11/1991 | Rajeevakumar | |
| 5,103,276 A | 4/1992 | Shen et al. | |
| 5,821,142 A | 10/1998 | Sung et al. | |
| 5,888,864 A | 3/1999 | Koh et al. | |
| 5,920,777 A | 7/1999 | Choi et al. | |
| 5,929,477 A | 7/1999 | Burns, Jr. et al. | |
| 5,977,579 A | 11/1999 | Noble | |
| 5,981,350 A | 11/1999 | Geusic et al. | |
| 5,985,729 A | 11/1999 | Wu | |
| 6,137,128 A | 10/2000 | Holmes et al. | |
| 6,255,684 B1 * | 7/2001 | Roesner et al. | 257/302 |
| 6,492,221 B1 | 12/2002 | Hofmann et al. | |
| 6,707,092 B2 | 3/2004 | Sasaki | |

* cited by examiner

*Primary Examiner*—Jack Chen
(74) *Attorney, Agent, or Firm*—Molly L. Sauter; Smith & Hopen, P.A.

(57) ABSTRACT

In accordance with the present invention, a novel method to fabricate topological capacitors is provided. The fabrication method of the instant invention is based upon a reversed surface topology utilizing deep reactive ion etching to establish conductive capacitive elements and non-conductive capacitive element groups.

12 Claims, 5 Drawing Sheets

METHOD OF MANUFACTURING SILICON TOPOLOGICAL CAPACITORS

CROSS REFERENCE TO RELATED APPLICATIONS

This application is a continuation of International Application No. PCT/US 2005/030715 entitled, "Method of Manufacturing Silicon Topological Capacitors", filed Aug. 30, 2005, which claims the benefit of priority to U.S. Provisional Patent Application 60/522,186, entitled, "Silicon Topological Capacitors", filed Aug. 27, 2004, the contents of which are herein incorporated by reference.

STATEMENT OF GOVERNMENT INTEREST

This invention was made with Government support under Grant No. DASG60-00-C-0089 awarded by the U.S. Space and Missile Defense Command. The Government has certain rights in the invention.

BACKGROUND OF INVENTION

The capacitor is one of the most important elements in electronics and is routinely used in dynamic random access memory circuits (DRAM), integrated circuits (IC) and energy storage devices. Capacitors, which consist of two conductors separated by an insulator, are considered a simple electronic component. However, producing capacitors in a chip requires highly specialized process steps. Prior art approaches to mass production of chip capacitors has resulted in the development of the trench capacitor.

It is known in the art to produce trench capacitors utilizing anisotropic etching of a silicon substrate. In the conventional trench capacitor cell, the plate electrode of the storage capacitor is inside the trench, and the storage electrode is in the substrate silicon. A dielectric film is then formed over the surface of the plate electrode. Typically, the upper place electrode of the capacitor is a polysilicon layer extending into the trench, thereby forming a capacitor for use as a memory cell. However, the functionality of capacitors relies on large surface areas. Alternating the deposition of the conductor and insulator on the silicon substrate to enhance capacity and/or using high dielectric constant materials as insulators are commonly employed in the art to form large capacitors. However, multi-layer depositions are not always suitable for integrated circuits and high dielectric constant materials, such as lead zirconate titanate (PZT) are not compatible with integrated circuits. To overcome these disadvantages, one of the simple solutions known in the art is the topological enhancement of the substrate surface. Topological enhancement involves using a very large number of small, deep holes in the substrate as shown with reference to FIG. 1. These deeps holes are commonly known as trench capacitors, which refers to the capacitors built into a trench etched in the semiconductor substrate. By utilizing a trench configuration, the surface area of the capacitor can be expanded, thereby increasing the capacitance, without increasing the area of the wafer needed to form the capacitor.

Plasma etching of high aspect ratio (depth-to-width) structures in silicon, such as deep trenches and holes, is a crucial step in manufacturing trench capacitors for memory devices, and integrated components for microelectromechanical systems (MEMS). In these applications, the goal is to etch deep structures anisotropically with high etch rates and high selectivity to the mask while maintaining good uniformity across the wafer.

The method of topological enhancement utilizing a large number of small, deep holes fulfills the requirement to provide large capacitors, but creates additional inherent problems. The high aspect ratio deep holes produced by methods known in the art are difficult to clean in the production process and the resulting contamination eventually degrades the capacitor.

While the required capacitance values remain relatively small for the integration of DRAM and transistors, other applications, such as energy storage capacitors, often require large capacitance values with smaller tolerances. A large capacitor inherently requires a larger surface area. In addition, many capacitors must be ground isolated for use as non-electronic voltage converters and transducers. In an AC transformer for DC circuits, the DC energy converts low or high voltage without loss. Therefore, a micromechanical switching circuit would exhibit advantages over conventional electronic switching devices for some applications.

MEMS switching converters are known in the art. There are many benefits to a MEMS implementation for switching converters, these benefits include; no voltage loss due to p-n junction, low ohm losses, radiation resistance, ability to convert voltage up and down, prolonged operation using hermetic seal with He gas, prolonged operation using Ir contacts, ability to charge all capacitors simultaneously or based on charge transfer, only simple vibrations needed to drive the circuits, need for two power supplies for some converters. However, larger surface area and low tolerance valued capacitors are required to realize these circuits.

Prior art topological enhancement techniques utilize a very large number of small, deep holes to fabricate large surface area, low tolerance value, capacitors for use in MEMS switching converters. Silicon surface-micromachining techniques are known in the art for establishing the small, deep holes for the prior art topological capacitors. These techniques include the Bosch process, also known as deep reactive ion etching, it additional to other silicon surface-micromachining techniques. These processes rely on the anisotropic etching of silicon; which means eroding the silicon wafer at different rates in different directions, so there is more control of the shape produced. However, the high aspect ratio deep holes in the silicon substrate formed by the prior art techniques are easily oxidized using thermal oxidation, and coating the surface conductive layers in deep holes is difficult to implement. The deep holes formed by the prior art methods are also difficult to clean without leaving contaminants in the holes. These contaminants reduce the lifetime of the device. Additionally, it is difficult to trim the capacitance value of the topologically enhanced capacitor fabricated utilizing the prior art methods.

Accordingly, what is needed in the art is an improved fabrication method for topological capacitors that overcomes the problems in the prior art.

SUMMARY OF INVENTION

The present invention provides a method of fabricating a topological capacitor, the method includes the steps of providing a silicon substrate having a top surface, depositing an etch mask on the top surface of the substrate, the etch mask further comprising etch lines defining a plurality of capacitive elements of a plurality of capacitive element groups and etch lines defining the plurality of capacitive element groups, wherein the width of the etch lines defining the plurality of capacitive element groups is greater than the width of the etch lines defining the plurality of capacitive elements within the group and anisotropically etching the substrate top surface identified by the etch mask to form a plurality of spaced pillar capacitive elements and a plurality of capacitive element groups. The spaced pillar capacitive elements are defined as being spaced vertical protrusions. These spaced pillars may form many shapes, including, but not limited to, columns, poles or plates. After the spaced pillar capacitive elements are formed, the method includes thermally oxidizing the etched substrate top surface, depositing a diffusion barrier adjacent to the oxidized surface, depositing a conductive layer adjacent to the diffusion barrier and depositing a polysilicon layer adjacent to the conductive layer thereby forming a topological capacitor having a plurality of capacitive elements and a plurality of capacitive element groups. The deposited polysilicon layer may then be annealed.

It is known in the art of anisotropic etching that the more narrow the etch trace, the slower the progress of etch process into the silicon substrate. As such, in accordance with the present invention the step of anisotropically etching the substrate top surface further includes, etching the etch lines defining the plurality of capacitive elements to a depth such that a layer of the conductive silicon substrate remains between the capacitive elements and etching the etch lines defining the plurality of capacitive element groups to a depth such that the capacitive element groups are no longer connected with a conductive silicon layer. These varying etch rates are made possible by varying the width of the etch trace patterned on the surface of the substrate. In a particular embodiment, the steps of etching the etch lines defining the capacitive elements and etching the etch lines defining the capacitive element groups are performed substantially simultaneously, or in the same etch step.

In an additional embodiment, the substrate may further include an insulation layer adjacent the bottom surface of the substrate and the step of etching the lines defining the plurality of capacitive element group comprises may further include etching to the depth of the insulation layer.

To provide additional structural reinforcement to the topological capacitor in accordance with the present invention, a sealant layer may be provided To further enhance the surface area of the capacitive elements, anisotropically etching the substrate top surface further includes anisotropically etching using scalloping vertical walls.

Once the capacitive elements and capacitive element groups are defined by the etching process, the capacitance value of the capacitive element group may be adjusted, or trimmed, by breaking off one or more of the spaced pillar capacitive elements. A sealant may then be applied to prevent arch discharge from the broken pillar.

The method in accordance with the present invention provides for electrical isolation between one group of capacitive elements and another group of capacitive elements. By varying the width of the paths between the groups and the elements, the etch rate is controlled such that the conductive substrate between the groups is etched away. To isolate the top deposited conductor, a laser trimmer is used to trim the deposited conductive layer between the groups as necessary for the particular application.

A connection between the topological capacitor and other circuit elements can be made by wire bonding a terminal to one of the spaced pillar capacitive elements. This particular connecting pillar may be fabricated to be larger than the other pillars in the group. Alternatively, the space between the spaced pillar capacitive elements may be filled with a dielectric resist and a connection may be provided with a thin film conductor.

While the surface area of the capacitor utilizing the method in accordance with the present invention remains the same, the reversed surface topology employed by the present invention has many advantages, including: ease of cleaning the entire surface of the topology, higher reliability due to less contamination of the entire surface, ease of producing the desired topology, ease of trimming capacitance values by breaking off one or more poles, ease or preventing arc discharge after trimming using sealant or paint, ease of reinforcing structural strength also using sealant or paint application, and ease of enhancing the surface area of the capacitor using scalloping vertical walls techniques.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
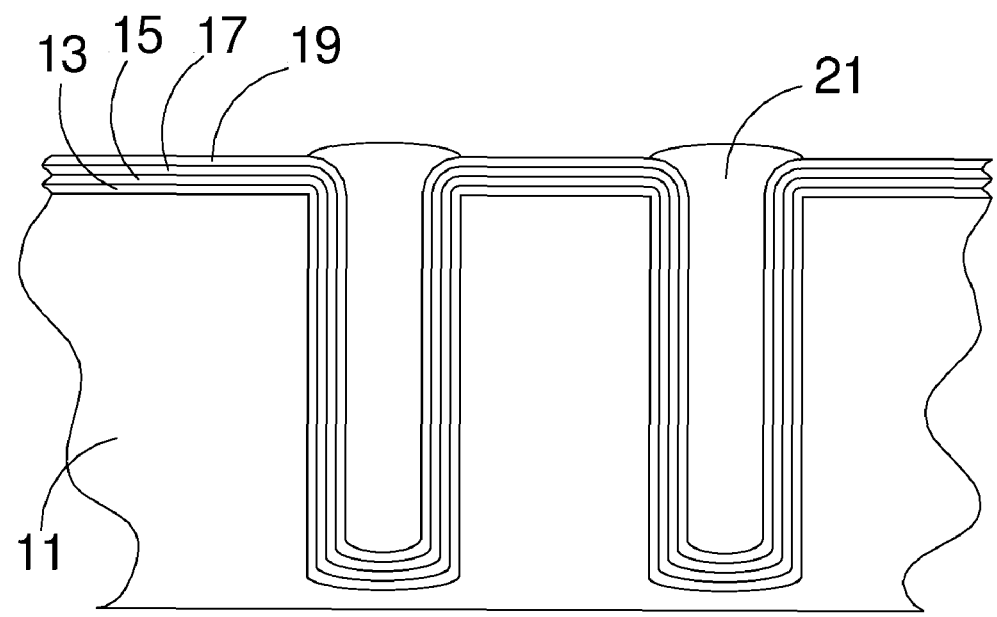
FIG. 1 is a diagrammatic view of the deep hole surface enhancement as is known in the Prior Art.

Deep-hole capacitors, as known in the prior art, are fabricated on a silicon substrate 11 as shown with reference to FIG. 1. Deep reactive ion etching or other chemical etching makes the deep holes 21 on the silicon substrate. The surface of the topologies are then exposed to oxygen in combination with a high temperature profile and therefore oxidized thermally. The nature of thermal oxidation covers the entire surface with a uniform $SiO_2$ layer 13. Then, the SiNx is coated by chemical vapor deposition as a diffusion barrier 15. Next, another layer polysilicon glass (PSG) 17 is deposited on the surface by chemical vapor deposition. The PSG provides doping material for the silicon layer, thereby creating a conductive electrode. The final layer 19 is polysilicon deposited by chemical vapor deposition. The four-layered coated topological capacitor is then annealed, so that the last layer or polysilicon will be phosphor doped and act as one electrode. In a specific embodiment, the deep hole is then filed with a dielectric material 21. The other electrode is the doped silicon substrate which in combination forms a large topological capacitor.

The capacitor as described above in the prior art is functional, however, the deep holes that are formed by the etching process are hard to clean and the process results in residual contaminants in the holes.

Additionally, the ground electrode associated with the prior art method is hard to isolate for some non-electronic DC voltage converters. In some applications, capacitors must be ground isolated for use as non-electronic voltage converters/transducers as shown with reference to the schematics of FIG. 2. The circuit diagrams shown in FIG. 2, the parallel series converter 41 and the charge transfer converter 43, illustrate the AC transformer for DC circuits. Thus, DC energy converts low or high voltage without loss.

In accordance with the present invention, a novel method to fabricate topological capacitors is provided. The fabrication method of the instant invention is based upon a reversed surface topology using the Bosch, or deep reactive ion etch, process or an equivalent as shown with reference to FIG. 3. It is known that the etching rates of the deep reactive ion etching process depend upon the opening dimensions. Accordingly, the etching rate of a 2 µm opening has a lower etching rate than that of a 5 µm opening. Taking advantage of this principle, the area within one group of the street of the topological capacitor elements in accordance with the present invention is narrower than the streets between the capacitive element groups. Therefore, the trenches between the groups 57 are deeper than those existing within the same groups 56. The deeper trenches reach the bottom of the silicon layer or insulation layers 53 and all groups are electrically separated. While within the groups, conducting silicon layers 55 remain and conduct displacement currents as shown with reference to FIG. 4. Accordingly, a group of capacitive elements 65 are formed by individual capacitive elements 67 separated by a trench extending to the insulative interface 53.

Figure 5:
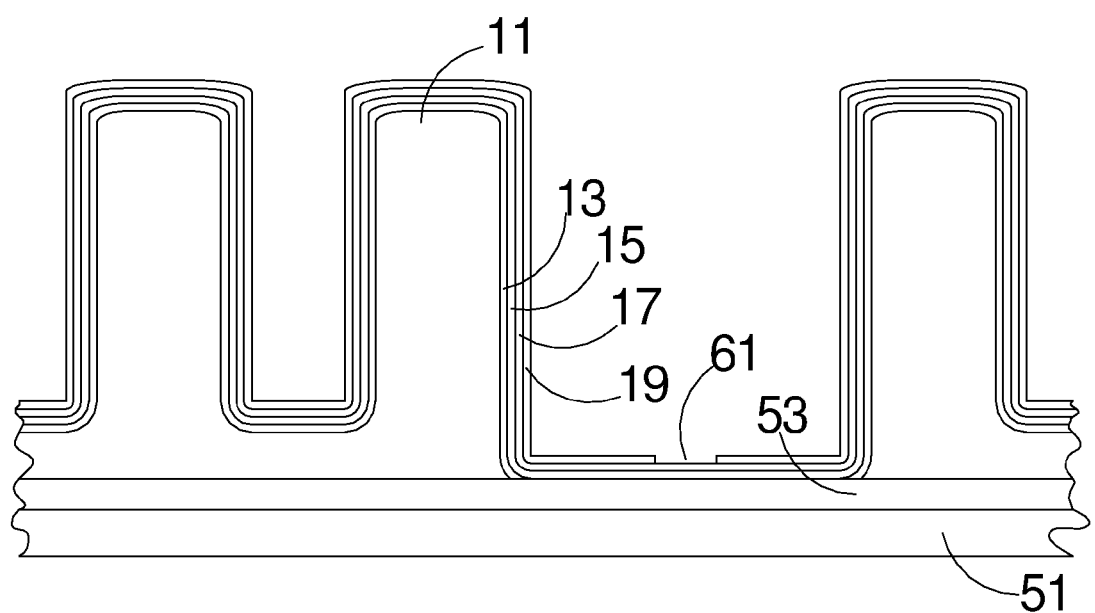
FIG. 5 is an illustration of a section of the capacitor formation in accordance with the present invention having a non-common ground capacitor.

With reference to FIG. 5, after establishing the protrusions to form the capacitive elements utilizing a deep reactive ion etching process, the silicon surface 11 is exposed to high temperature in an oxygen atmosphere thereby forming a very thin layer of thermal oxide 13, approximately 20 nm thick. Next, the surface is coated with SiNx to create the diffusion barrier 15. Next, the surface is covered by PSG as a dopant source 17 following polysilicon or conductive silicon as a top electrode 19 after high temperature annealing. The conductive silicon substrate 11 is utilized as a bottom electrode, but in accordance with the method of the present invention, the bottom electrode is already isolated between a group of stems or poles (one capacitor) from other capacitor due to the varying etching rates made possible by the varied etch widths. Next, a top silicon conductor 19 is isolated using the laser trimmer 61. A larger stem or pole may be used for connection terminals. A wire bonder provides the connections without filling, or thin film conductors provide the connections after being filled by dielectric resist or equivalents.

Figure 2:
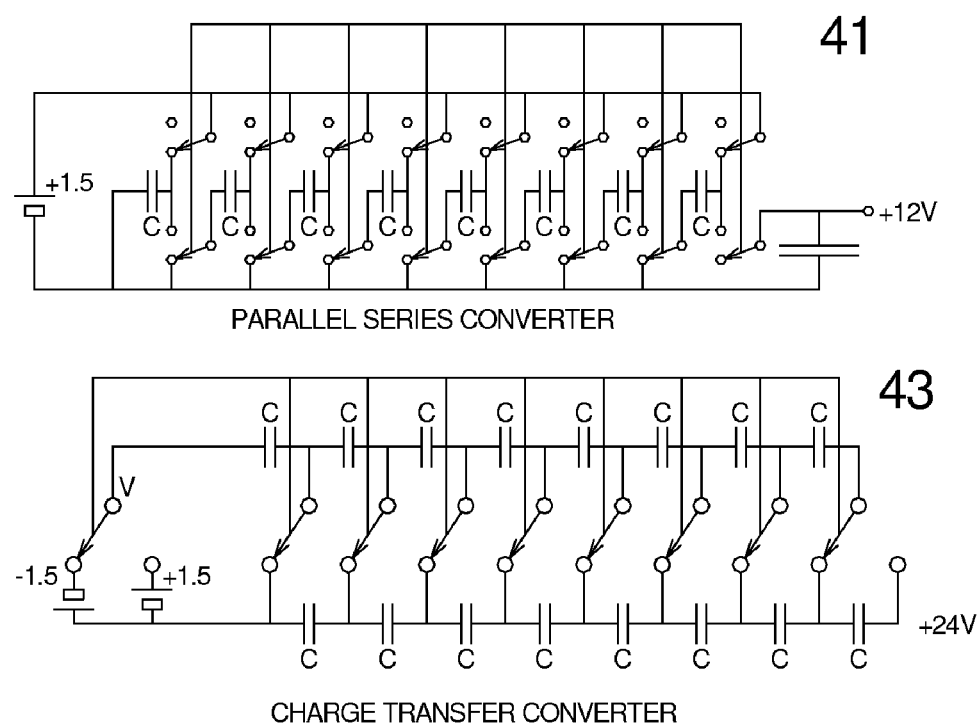
FIG. 2 is a diagrammatic view of MEMS switching array converters as known in the Prior Art.
Figure 3:
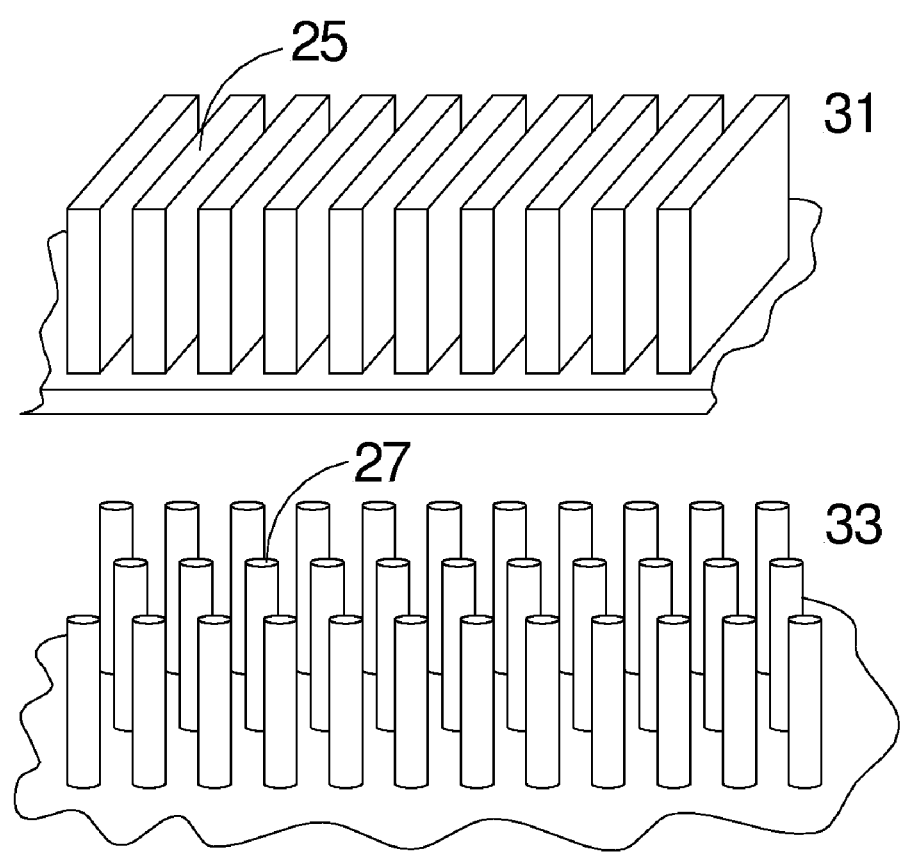
FIG. 3 is a diagrammatic view of the reversed topology surface enhancement in accordance with the present invention.
Figure 4:
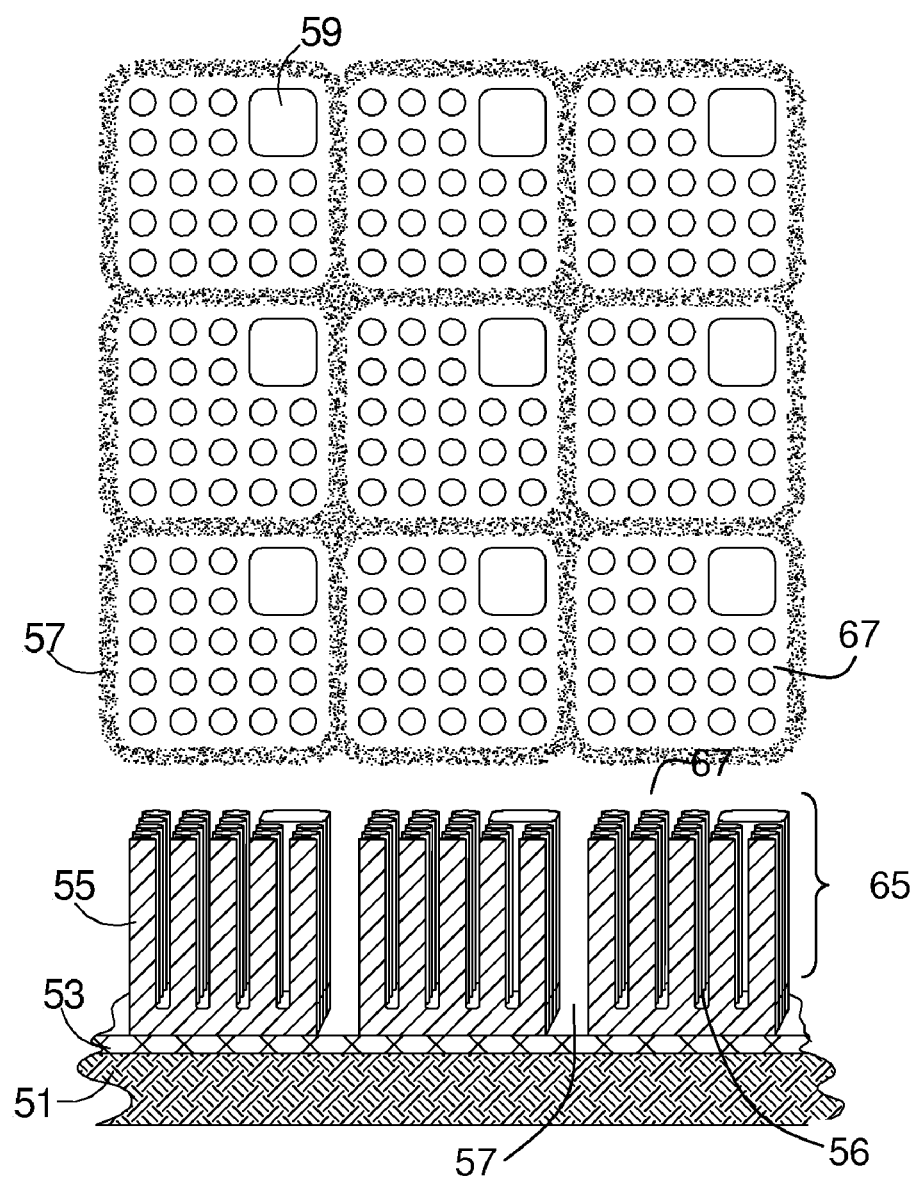
FIG. 4 is a diagrammatic view of a nine-capacitor formation after the anisotropic etching process in accordance with the present invention.

As shown with reference to FIG. 3, the process in accordance with the present invention establishes etched protrusions, which may take the shape of columns 27, pillars, poles or partial walls 25. In accordance with the present invention, a solution to the problems of the prior art is based on the reversed topology as shown with reference to FIG. 3. As shown in FIG. 2, many partial walls 25 in slotted structures are shown in 31 and many poles or stems 27 are shown in 33. These capacitors are used for the parallel series converter 41 and charge transfer converters 43 as shown in FIG. 2. The capacitors in these converters cannot share a common ground. These capacitors also require strict tolerances. Trimming the capacitor is achieved by breaking a few plates 25 or poles 27 as shown in FIG. 2. Each group of poles or plates or combinations forms one capacitor. As shown in FIG. 4 and FIG. 5, the wider streets between groups are deeper etched than the narrow street within a group and reach insulation layer 53, so that each capacitor ground is separated. Thus, the grounds between the groups are electrically separated by deeper channel 57. Laser trimming 61 as shown in FIG. 5 isolates the top silicon electrode. The top and bottom electrodes are connected to the switching circuits using larger stem pad 59 as shown in FIG. 4. The substrate may have additional backside support 51 as shown with reference to FIG. 5.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method of fabricating a topological capacitor, the method comprising the steps of:
   providing a silicon substrate having a top surface;
   depositing an etch mask on the top surface of the substrate, the etch mask further comprising etch lines defining a plurality of capacitive elements of a plurality of capacitive element groups and etch lines defining the plurality of capacitive element groups, wherein the width of the etch lines defining the plurality of capacitive element groups is greater than the width of the etch lines defining the plurality of capacitive elements within the group;
   anisotropically etching the substrate top surface identified by the etch mask to form a plurality of spaced pillar capacitive elements and a plurality of capacitive element groups;
   thermally oxidizing the etched substrate top surface;
   depositing a diffusion barrier adjacent to the oxidized surface;
   depositing a conductive silicon substrate layer adjacent to the diffusion barrier; and
   depositing a polysilicon layer adjacent to the conductive layer thereby forming a topological capacitor having a plurality of capacitive elements and a plurality of capacitive element groups.

2. The method of claim 1, wherein the step of anisotropically etching the substrate top surface further comprises, etching the etch lines defining the plurality of capacitive elements to a depth such that a layer of a conductive silicon substrate remains between the capacitive elements and etching the etch lines defining the plurality of capacitive element groups to a depth such that the capacitive element groups are no longer connected with the conductive silicon layer.

3. The method of claim 2, wherein the etching steps are performed substantially simultaneously.

4. The method of claim 2, wherein the substrate further comprises an insulation layer adjacent to a bottom surface of the substrate and the step of etching the etch lines defining the plurality of capacitive element group comprises etching to the depth of the insulation layer.

5. The method of claim 1 further comprising the step of annealing the deposited polysilicon layer.

6. The method of claim 1, further comprising the step of applying a sealant layer to provide structural reinforcement.

7. The method of claim 1, wherein the step of anisotropically etching the substrate top surface further comprises anisotropically etching using scalloping vertical walls to enhance the surface area of the capacitive elements.

8. The method of claim 1, further comprising the step of trimming the capacitance value of the capacitive element group by breaking off one or more of the spaced pillar capacitive elements.

9. The method of claim 8, further comprising the step of applying a sealant to the broken capacitive element to prevent arc discharge.

10. The method of claim 1, further comprising the step of laser trimming the deposited conductive layer.

11. The method of claim 1, further comprising the step of connecting a terminal to the deposited conductive layer of one of the spaced pillar capacitive elements.

12. The method of claim 1, further comprising the step of filling a space between the spaced pillar capacitive elements with dielectric resist and providing a terminal connection with a thin film conductor.

\* \* \* \* \*